US008811915B2

(12) United States Patent  (10) Patent No.: US 8,811,915 B2
Bhanji et al.  (45) Date of Patent: Aug. 19, 2014

(54) DIGITAL WIRELESS NARROW BAND RADIO

(75) Inventors: Riyaz Bhanji, Toronto (CA); Mark Wright, Toronto (CA); Iain Roy, Kemble (CA)

(73) Assignee: Psion Inc., Mississauga, Ontario (CA)

( * ) Notice: Subject to any disclaimer, the term of this patent is extended or adjusted under 35 U.S.C. 154(b) by 907 days.

(21) Appl. No.: 11/072,056

(22) Filed: Mar. 4, 2005

(65) Prior Publication Data
 US 2006/0199622 A1 Sep. 7, 2006

(51) Int. Cl.
 *H04B 1/38* (2006.01)
 *H04B 1/40* (2006.01)
 *H05K 1/18* (2006.01)
 *H05K 1/02* (2006.01)

(52) U.S. Cl.
 CPC ............... *H04B 1/40* (2013.01); *H05K 1/0243* (2013.01); *H05K 2201/09972* (2013.01); *H05K 2203/1572* (2013.01); *H05K 1/18* (2013.01); *H05K 1/0218* (2013.01)
 USPC .................... 455/73; 455/7; 455/76; 370/315

(58) Field of Classification Search
 CPC .................................... H04B 1/38; H04B 1/40
 USPC .................. 455/575, 575.1, 73, 550.1, 7, 76; 370/315
 See application file for complete search history.

(56) References Cited

U.S. PATENT DOCUMENTS

| 5,028,887 | A | * | 7/1991 | Gilmore | 331/18 |
| 5,495,202 | A | * | 2/1996 | Hsu | 327/113 |
| 5,535,432 | A | * | 7/1996 | Dent | 455/77 |
| 6,539,207 | B1 | * | 3/2003 | del Castillo et al. | 455/90.3 |
| 6,917,823 | B2 | * | 7/2005 | Katagishi et al. | 455/571 |
| 6,930,627 | B1 | * | 8/2005 | Hopkins | 341/144 |
| 7,098,821 | B2 | * | 8/2006 | Husted et al. | 341/61 |
| 7,202,941 | B2 | * | 4/2007 | Munro | 356/5.01 |
| 7,542,520 | B1 | * | 6/2009 | Estrada | 375/303 |
| 2002/0094053 | A1 | * | 7/2002 | Blazo | 375/376 |
| 2002/0163472 | A1 | * | 11/2002 | Kasuya et al. | 343/702 |
| 2003/0017840 | A1 |   | 1/2003 | Katagishi et al. |   |
| 2003/0151684 | A1 | * | 8/2003 | Shimazaki et al. | 348/252 |

(Continued)

OTHER PUBLICATIONS

Canadian Office Action dated Jul. 8, 2010.

(Continued)

*Primary Examiner* — Raymond Dean

(57) ABSTRACT

A network communication card is provided for facilitating ultra high frequency (UHF) radio communication between a terminal and a base station, the network communication card being in communication with an antenna and comprising a double-sided multilayer printed circuit board (PCB). The PCB comprises a digital interface, a receiver and a transmitter. The digital interface provides communication between the PCB and the terminal. The receiver receives incoming radio signals from the base station and processes the received signals for communication to the terminal via the digital interface. The transmitter transmits outgoing radio signals from the terminal via the digital interface to the base station and includes the following components. A digital synthesizer provides a highly accurate modulated carrier signal. An upconversion circuit increases the frequency of the carrier signal. A filter filters spurious content from the carrier signal. A phase locked loop (PLL) comprising a synthesizer and a voltage controlled oscillator (VCO) generates a transmission signal from the filtered carrier signal. A transmission circuit transmits the transmission signal via the antenna.

13 Claims, 2 Drawing Sheets

(56) References Cited

U.S. PATENT DOCUMENTS

| | | | |
|---|---|---|---|
| 2004/0028149 A1* | 2/2004 | Krafft et al. | 375/316 |
| 2004/0113703 A1* | 6/2004 | Smith | 331/1 A |
| 2004/0240190 A1* | 12/2004 | Hsu et al. | 361/797 |
| 2005/0285773 A1* | 12/2005 | Hartzstein et al. | 342/70 |
| 2006/0121864 A1* | 6/2006 | Rodgers et al. | 455/182.1 |

OTHER PUBLICATIONS

Office Action for counterpart Canadian Patent Application No. 2499328, dated Jun. 29, 2011.

Notice of Allowance for counterpart Canadian Patent Application No. 2499328, dated Jul. 31, 2012.

* cited by examiner

DIGITAL WIRELESS NARROW BAND RADIO

The present invention relates generally to narrowband radios and specifically to a digital wireless narrow band radio having a small form factor.

BACKGROUND OF THE INVENTION

The advent of Wireless Local Area Network (WLAN) solutions and miniaturization of radios has forced traditional hand-held terminal technology to reduce in size. Specifically, wireless technology has reduced in size and been combined with a digital network interface such that they comply with the Personal Computer Memory Card International Association (PCMCIA) form factor. Accordingly, wireless networking PC cards can be used to transform any computing device with a PCMCIA slot into a wireless device.

An example of such a WLAN solution is the 802.11 specifications. The 802.11 specifications are an evolving family of specifications for WLANs developed by a working group of the Institute of Electrical and Electronics Engineers (IEEE). There are several specifications in the family and new ones are occasionally added. Currently wireless communication devices built in accordance with the 802.11 specifications are capable of transferring data at rates up to 54 Mbps and at a distance of up to 250 meters, although the practical transmission distance actually achieved is significantly lower. In fact, typical achievable ranges are approximately 100 meters and less.

Increasingly, however, hand-held terminals having long-range radio solutions are being required. For example, wireless inventory devices used in warehouses, manufacturing facilities, and dockyards are typically used in excess of the maximum distance afforded by current technology.

One current solution to this problem is to provide repeaters to extend the range of the wireless communication device. However this solution is costly, impractical, and may increase the likelihood of a transmission error since the data has to be passed through an increased number of devices. Another current solution is to use standard narrow band ultra high frequency (UHF) radio technology with the hand-held technology. However, the size of the technology currently being implement consumes significant power and renders the hand-held terminal unwieldy and, as such, impractical.

Accordingly, it can be seen that there is a need for a wireless communication device that combines the power consumption and size of current WLAN technology with the transmission distance of narrow band UHF radio technology.

SUMMARY OF THE INVENTION

In accordance with an aspect of the present invention there is provided a network communication card for facilitating ultra high frequency (UHF) radio communication between a terminal and a base station, the network communication card being in communication with an antenna and comprising a double-sided multilayer printed circuit board (PCB), the PCB comprising: a digital interface for communicating between the PCB and the terminal; a receiver for receiving incoming radio signals from the base station and processing the received signals for communication to the terminal via the digital interface; a transmitter for transmitting outgoing radio signals from the terminal via the digital interface to the base station, the transmitter including: a digital synthesizer for providing a highly accurate modulated carrier signal; an upconversion circuit for increasing the frequency of the carrier signal; a filter for filtering spurious content from the carrier signal; a phase locked loop (PLL) comprising a synthesizer and a voltage controlled oscillator (VCO) for generating a transmission signal from the filtered carrier signal; and a transmission circuit for transmitting the transmission signal via the antenna.

BRIEF DESCRIPTION OF THE DRAWINGS

An embodiment of the present invention will now be described by way of example only with reference to following drawings in which.

DETAILED DESCRIPTION OF THE PREFERRED EMBODIMENT

Figure 1:
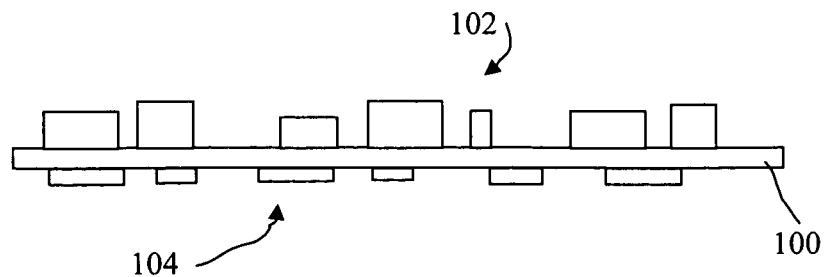
FIG. 1 is a side view of a double-sided PCB used in an embodiment of the invention.

For convenience like numerals in the description refer to like structures in the drawings.

The following describes a PC-card radio for use with a computing device. The PC-card radio uses narrowband technology to increase the range from the typical 100 meters of 802.11 radios to approximately 1.6 kilometers while maintaining a PCMCIA form factor. In the present embodiment, the form factor of the PC-card radio is PC-Card Type III and includes a cast magnesium enclosure. A cast magnesium enclosure was selected to endure mechanical ruggedness standards. Further, this need for mass was used to improve EM shielding of the device in general. Further, the PC-card radio conforms to European Telecommunications Standards Institute (ETSI), EN300-113 requirements.

In the present embodiment, the PC-card radio is a half-duplex digital packet radio supporting a narrowband wireless networking system described as follows. The PC-card radio uses an ultra high frequency (UHF) radio and is capable of operating in frequency bands of 403-422 MHz, 419-435 MHz, 435-451 MHz, 450-470 MHz, 464-480 MHz, 480-496 MHz and 496-512 MHz with an output power of 30 dBm (1 Watt). The PC-card radio uses binary frequency shift key (2-FSK) modulation for transmission at 9,600 baud per second (bps) and 4,800 bps and 4-FSK modulation for transmission at 19,200 bps and 9,600 bps. The modulation schemes used by the PC-card radio may include both common and proprietary schemes, as will be appreciated by a person skilled in the art. The receiver sensitivity, with possible frequency stepping increments of either 6.25 kHz, 10 kHz or 12.5 kHz. The PC-card radio uses a 5V (±5%) power source through the PCMCIA card slot.

The PC-card radio uses a new single-path modulation scheme for improved robustness over existing two-path modulation schemes and uses a direct digital synthesis transmitter that is adaptable to modulation schemes required by different countries. Further, tests have shown that the PC-radio card power consumption is less than 60 mA in quiescent mode, less than 150 mA when receiving and less than 1000 mA, when transmitting 1 W of RF output power at the antenna.

Recent manufacturing advancements have significantly reduced the size of radio frequency (RF) components for UHF transmission. Although these RF components have been reduced in size, they are not necessarily small enough to fit on a single board along with the required digital components, while still maintaining a form factor conformant with PCMCIA standards.

Accordingly, a double-sided multilayer printed circuit board (PCB) was used to layout the circuit. In the present embodiment, a 14-layer board was used. Referring to FIG. 1, a side view of the PCB is illustrated generally by numeral 100. In accordance with the present embodiment, an analog side 102 of the PCB 100 primarily comprises components for analog UHF communication, while a digital and mixed-signal side 104 of the PCB 100 primarily comprises components for digital communication. The PCB is of a form factor that conforms to PCMCIA standards.

The analog side 102 of the PCB 100 comprises a transceiver, which is described in detail with reference to FIG. 2. The transceiver 200 comprises a receiver 202 for receiving signals from an antenna and a transmitter 250 for transmitting signals via the antenna.

The digital side 104 of the PCB 100 comprises a digital signal processor (DSP), a flash memory, a field programmable gate array and digital potentiometers. The components on the digital side 104 are used for interfacing between the PC-card radio and a device into with the PC-card radio is to be inserted, via input/output pins (not shown) as well as for providing electronic control (tuning) of analog circuits on the analog side 102.

The DSP is implemented using a TMS320VC5410 Integrated Circuit for controlling the receiver 202 and transmitter 250. It enables power voltage regulators as required, programs coder/decoders (CODECs), phase locked loops (PLL) synthesizers, direct digital synthesizer (DDS) and the digital potentiometer, as well as performing baseband modem filtering, symbol timing recovery and encoding/decoding. The DSP communicates with the DDS and the CODEC via Multichannel Buffered Serial Ports (McBSP). The control pin of the PLL synthesizers, digital potentiometers and power voltage regulators are connected to corresponding programmable input/output (I/O) pins of the FPGA. These pins are mapped to a FPGA register space. The DSP controls these pins by setting the corresponding bits of the FPGA registers The flash memory provides non-volatile storage of DSP and FPGA firmware and factory calibrated tuning parameters. This design can accept either 4-Mbit flash memory, such as M29W400BT, M29W400DT or AM29LV400DT Integrated Circuits, or 8-Mbit flash memory, such as M29W800DT, or AM29LV800DT Integrated Circuits. Other embodiments will become apparent to a person of ordinary skill in the art.

The FPGA is implemented using an XC2S50 Integrated Circuit for providing a PC-card host physical interface and expanding the I/O capability of the DSP. It has 128×16 Card Information Structure (CIS) memory space and 4K×16 common memory space. The DSP has both read and write access to the CIS memory and common memory. The PC-card host has read and write access to the common memory but only read access to the CIS memory. In addition, the FPGA has 2K×16 register space.

10 kΩ, 256-position digital potentiometers are implemented using an AD5204BRU10 Integrated Circuit for providing digital tuning of voltage controlled crystal oscillators and the receive demodulator. The digital potentiometers are programmed by the DSP via the FPGA.

Using a double-sided multilayer PCB 100 as described above effectively doubles the circuit board surface area available with which to design the communication card while minimizing the overall area used. However, placing the RF components and digital components in such a compact area introduces complications.

For example, spurious issues became a problem due to the small physical space. Consider a wireless card operating at one frequency (channel) that has to be able to operate in the presence of other transmitters and receivers operating in adjacent channels. For this reason, transmitted signals need to be well behaved with respect to adjacent channel power spillover. Due to space constraints, a clean and very low noise transmitted signal with low spillover becomes a technical challenge. Accordingly, spurious effects become that much more difficult to avoid. Accordingly, a modulation scheme is required that produces inherently low spurious effects.

The PC-card radio of the present embodiment is designed for situations that require a modulation bandwidth that extends down to hundreds of Hertz. When faced with this challenge, the typical method of frequency modulation (FM) in transmitters is to split the modulation into two paths, which is known as two-point FM.

Two-point FM is described in general as follows. Voltage controlled oscillators (VCOs) in a phase-locked loop (PLL) system do not respond well to low frequency content due to their inherent high pass filter characteristic. Accordingly, the lower frequency content of the signal to be transmitted is modulated using a master clock as a reference for a synthesizer. The higher frequency content is modulated directly through the VCO. These two 'paths' are then carefully balanced via tuning and adjustment in order to create a flat modulation response, which is highly desirable for accurate receiver function. However, the challenge of implementing this 'modulation balance' is often difficult to achieve and so a single-path modulation scheme, without the need for any tuning or adjustment, was developed.

A single-path modulation scheme is implemented using a direct digital synthesizer (DDS) and phase locked loop (PLL). However, tight band control that would not distort the data signal is achieved through the development of advanced filtering techniques, resulting in the ability to transmit the signal without also transmitting spurious signals.

In order to achieve this, the loop bandwidth of the PLL system needs to be greater than the information bandwidth of the signal to be modulated. Due to regulatory specifications, the loop bandwidth also needs to be as narrow as possible to meet adjacent channel power requirements of 67 dBc (at 25 kHz from the carrier). Therefore, what is required is a loop bandwidth large enough to pass the modulated signal but small enough to meet adjacent channel power restrictions. Yet further, the solution had to be capable of being implemented on a low power device, such as a battery-operated terminal or radio, without the need for manual tuning or adjustment, and physically small enough to meet space constraints described with reference to FIG. 1.

Figure 2:
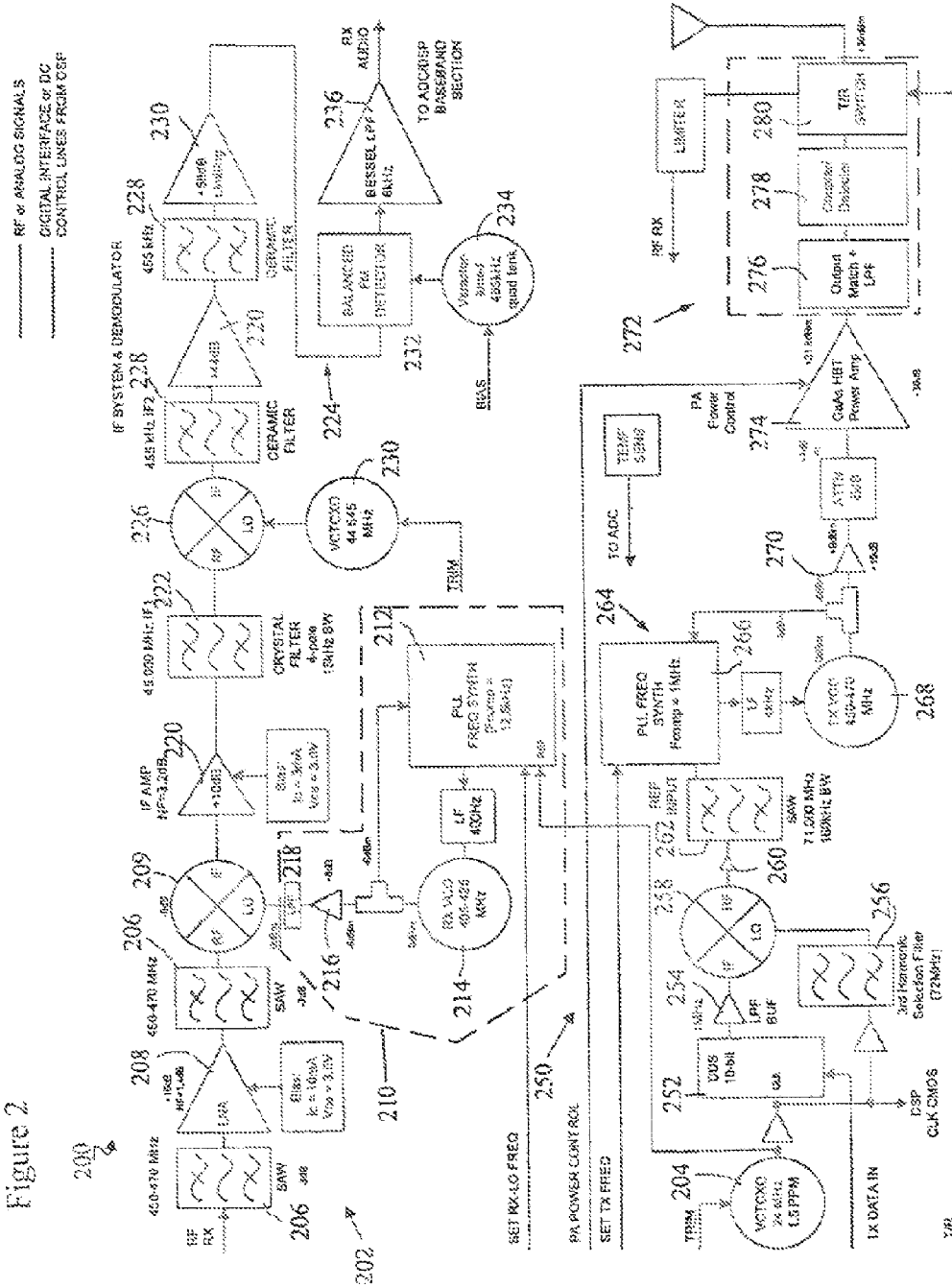
FIG. 2 is a block diagram of a transmitter and receiver implemented on the PCB illustrated in FIG. 1.

Referring to FIG. 2, a block diagram of a PC-card transceiver in accordance with the present embodiment is illustrated generally by numeral 200. The transceiver 200 comprises a receiver 202 and a transmitter 250. The receiver 202 comprises components laid out in a manner that is standard in the art and, accordingly, need not be described in great detail. The following briefly describe the receiver 202.

A modulated input signal is received from a base station at an antenna on the handheld terminal. The antenna is coupled to the receiver for receiving incoming signals. The receiver is a dual-conversion superheterodyne architecture with a first inter-frequency (IF) at 45.000 MHz and a second IF at 455 kHz. Low-side local oscillators are used at both downconversion stages. The main reference is a 24.000 MHz voltage-controlled, temperature-compensated crystal oscillator (VCTCXO) 204. The main reference 204 provides a reference for both the transmitter 250 and the receiver 202. The frequency of the main reference can be adjusted by a digital potentiometer (not shown) under DSP firmware control. Oscillators age and 'drift' (go off frequency) as a result. Using digital potentiometers with electronic control allows tuning to be implemented without going through costly manual tuning and repair. Further, it is possible also to implement a software driven crystal oscillator adjustment through the host computer or terminal driving the radio.

A limiter (not shown) is provided for protecting other receiver components from damage due to large alternating current (AC) signals. An anti-parallel Schottky diode pair is used for the limiter.

RF surface acoustic wave (SAW) bandpass filters 206 pass a desired frequency band and reject out of band signals including those at the image frequency, $f_{RF}$–90 MHz. The SAW filters 206 provide approximately 3.5 dB of insertion loss.

A low-noise amplifier (LNA) 208 is coupled between the SAW filters for providing 16 dB of RF gain, using Silicon Germanium (SiGe) Heterojunction Bipolar Transistor (HBT) technology.

A first mixer 209 downconverts the RF signal from the SAW filter 206 to the first IF at 45.000 MHz using a receiver local oscillator 210. The mixer provides approximately 6 dB of conversion loss and is a passive field effect transistor (FET) type.

The receiver local oscillator 210 comprises a receiver PLL synthesizer 212, a receiver VCO 214, a local oscillator buffer amplifier 216, and a discrete lowpass harmonic filter 218. In the present embodiment, the receiver PLL synthesizer 212 is a LMX2316 Integrated Circuit having a comparison frequency of 12.5 kHz or 6.25 kHz. The input reference to the receiver PLL synthesizer is the 24.000 MHz main reference 204. The output of the lowpass harmonic filter 218 provides a 0 dBm local oscillator signal to the first mixer 209.

An IF amplifier 220, comprising SiGe HBT technology, provides 10 dB of IF gain to the output of the first mixer 209. An IF filter 222 comprises a four-pole crystal filter for filtering the output of the IF amplifier 220. The IF filter 222 passes a single channel (15 or 7.5 kHz 3 dB bandwidth depending on implementation) at 45.000 MHz and rejects off-channel interfering signals. Such interfering signals include those at the $2^{nd}$ IF LO image frequency, 44.090 MHz, by greater than 70 dBc.

The output of the IF filter 222 is input to an IF System 224. In the present embodiment, the IF system 224 is implemented using an SA606 Integrated Circuit and includes a second mixer 226, an IF amplifier 220, ceramic filters 228, a limiting amplifier 230, a FM demodulator 232, and a Received Signal Strength Indicator (RSSI).

The 45.000 MHz first IF signal is downconverted to 455 kHz by the second mixer 226 using the second local oscillator. The second local oscillator 238, comprising a VCTCXO operating at 44.545000 MHz, provides a local oscillator signal to the second mixer 226. The IF amplifiers 220 and limiting amplifier 230 provide 102 dB of IF gain. The FM demodulator 232 recovers the original baseband data signal. A digital potentiometer (not shown) under firmware control provides a tuning voltage to a varactor-tuned quad tank 234, which allows it to be accurately tuned for selecting the frequency for the FM demodulater 232. The quad tank is temperature compensated.

Lowpass filter 236 filters the recovered data signal from the FM demodulator 232 at 8 kHz and buffers the signal before it is passed to an analog-to-digital converter (ADC) in a coder decoder (codec) (not shown).

The codec is implemented using a TLV320AIC24 Integrated Circuit and samples the recovered data signal at a frequency of 76.8 kS/s and a resolution of 16 bits. The codec also digitizes the RSSI signal. The codec is controlled by and interfaced with the DSP and may also be used to generate analog test signals.

The transmitter 250 will now be described in detail. The transmitter 250 comprises a direct digital synthesizer (DDS) 252, a DDS buffer 254, a harmonic selection filter 256, a transmit mixer 258, a transmit reference buffer 260, a transmit SAW filter 262, a transmit oscillator 264, a pre-drive amplifier 270 and a transmission circuit 272. The transmit oscillator 264 comprises a transmit PLL synthesizer 266 and a transmit VCO 268. The transmission circuit 272 comprises a standard transmission architecture and includes a transmit power amplifier 274, a transmit filter 276, a power detector 278 and a transmit/receive switch 280. The transmission circuit 272 is coupled to the antenna for transmitting the modulated signal to the base station.

The DDS 252 is an integrated circuit that provides a small, low power, numerically controlled oscillator that allows for programmable multi-level phase-continuous FSK generation. DDSs 252 generally are highly accurate and are tunable to micro-hertz frequencies. However, they suffer from the maladies of all sampled data system including quantization noise, aliasing, spurious output, and the like. In particular, the published specification for the AD9833 DDS used in the present embodiment shows a spurious-free dynamic range to be approximately 60 dBc (to Nyquist frequency) and approximately 78 dBc (to about 200 kHz).

Accordingly, due to tight regulatory specifications (−36 dBm to 1 GHz) for spurious emissions, it is unfeasible to input such a noise profile directly into the reference of the transmitter PLL 266. In order to overcome this limitation, an upconversion scheme was deployed resulting in reduced spurious content at the output of the transmit oscillator 264. The DDS 252 and components used in the upconversion scheme are described as follows.

The DDS 252 produces a 1 MHz carrier signal. Its reference clock is a 24.000 MHz 5V CMOS clock, which is derived from the main reference 204. The DDS 252 includes a sine wave lookup table, which is used to digitally construct a phase-continuous sine wave. The rate of phase increment, or frequency, is determined by a register value programmed into the DDS 252 by the DSP. 2-FSK and 4-FSK modulation are achieved by varying the applied frequency programming word in accordance with the desired data encoding. Similarly, the desired FM deviation is achieved by scaling the offset from the nominal carrier frequency accordingly. As a result, DDS 252 effectively acts as a current-output 10-bit, 25 MS/s digital-to-analog converter (DAC). The DDS nominal frequency is varied within about 80 kHz (from 920 kHz to 1080 kHz) to allow fine channel stepping while using a relatively high comparison frequency of 1 MHz for the transmit PLL 266. The FSK modulated output signal of the DDS 252 is input to the DDS buffer 254.

The DDS buffer 254 provides a reconstruction and harmonic lowpass filter and buffer, allowing a 50Ω load to be driven. The signal level at output of the DDS buffer is about −3 dBm and is input to the transmit mixer 258.

The selection filter 256 comprises a discrete bandpass filter for selecting a strong third harmonic from the 24.000 MHz 5V CMOS clock signal. This selected signal is used as an input signal to the transmit mixer 258. The output of the transmit mixer 258 is input to the transmit SAW filter 262 via the transmit reference buffer 260. The output of the transmit SAW filter 262 is used as a reference for the transmit PLL 266. The transmit PLL 266 and transmit VCO 268 generate a modulated RF carrier, which is transmitted using the transmission circuit 272 as is standard in the art.

The operation of the upconversion scheme is described as follows. The transmit mixer 258 takes a lower frequency modulated signal from the DDS 252 at 1 MHz and mixes it with the third harmonic of the transceiver's master clock at (24×3=) 72 MHz for an output at 73 and 71 MHz. The signal is then amplified by the transmit reference buffer 260 and filtered by the transmit SAW filter 262.

The transmit SAW filter 262 provides a 71 MHz SAW filter that passes +/−80 kHz channel bandwidth. This allows enough bandwidth to adjust the centre (channel) frequency at the DDS to take advantage of its accurate tuning, while filtering out spurious content before the transmit PLL 266.

The transmit PLL 266 takes the 71 MHz output from the transmit SAW filter 262 as its reference input. The 71 MHz signal is divided down in the reference divider circuit of the PLL 266, to a reference signal at a comparison frequency of 1 MHz. A person of ordinary skill in the art will appreciate that this comparison frequency was selected as a design choice and may differ between implementations. The reference signal is passed to the VCO 268 for generating the RF output frequency. The RF output frequency is fed back to the PLL 266 and divided down to the comparison frequency. The divided down RF signal and the reference signal are compared via a phase comparator. Once these signals match, the PLL is said to be locked and the output RF signal is ready to be transmitted.

For lower frequencies, such as approximately 1 MHz, SAW technology is not readily available within the space constraints required by the present embodiment. Accordingly, the transceiver 200 described above can be implemented in a very small area. Yet further, the noise profile of the signal is spurious-free to a greater degree after upconversion, filtering and downconversion, than had upconversion not been used. The reference divider at the input of the transmit PLL 'divides down' the noise profile by a factor of (20 log 72=) 37 dB.

Figure 3:
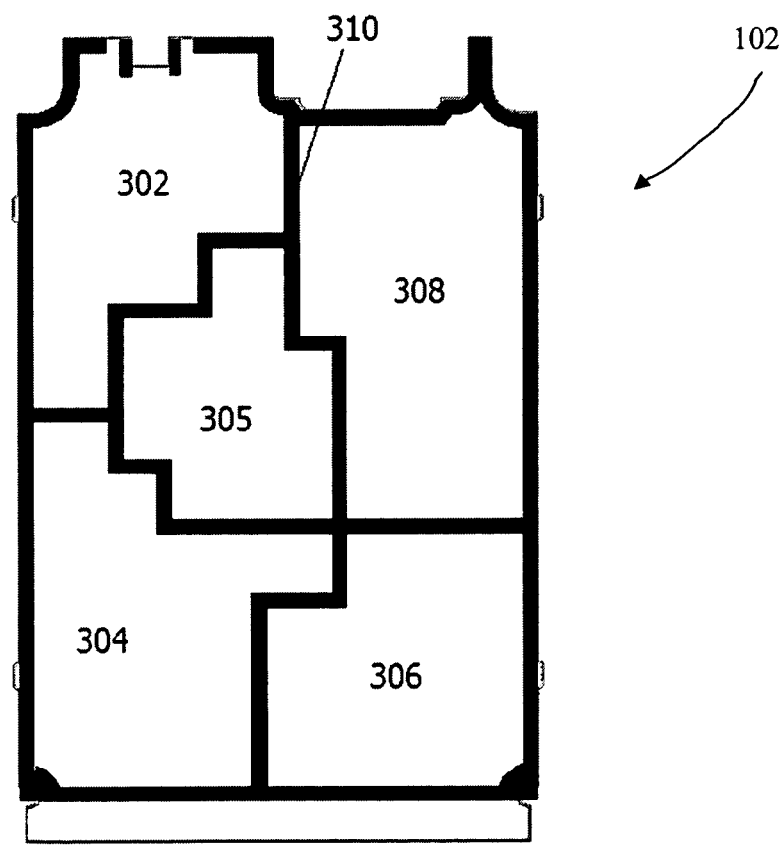
FIG. 3 is a schematic diagram illustrated how the transmitter and receiver can be compartmentalized into different regions on the PCB.

In order to achieve an efficient use of space while reducing coupling between components, the design of the analog side was separated into several sections. Referring to FIG. 3, the analog side 102 of the PCB 100 is shown. In the present embodiment the analog side 102 is separated into five sections 302, 304, 305, 306, and 308. Three sections 302, 304 and 305 are used for the receiver 202 and two sections 306 and 308 are used for the transmitter 250. Thus it can be seen that in addition to isolating the transmitter 250 from the receiver 202 and vice versa, certain portions of the receiver and transmitter are isolated from each other.

Each of these sections 302, 304, 305, 306 and 308 is bordered by a conducting ground trace 310 on the surface of the PCB 100. The magnesium-alloy cast housing (not shown) includes shield walls with conductive gasket applied to the 'lip' of the walls. When the PCB is housed, the shield walls are aligned with conducting ground traces 310 on the PCB 100, effectively creating five separate compartments. Accordingly, the conducting ground traces 310 enable conductivity from the ground (reference) electrical plane of the PCB into the enclosure, thus 'caging' each circuit section in a Faraday cage. The compartments are electrically connected by conductive striplines, not shown, buried beneath the conductive ground traces 310.

The transmitter is separated into two components 306 and 308 due to interaction of the transmit oscillator 264 with the transmit power amplifier 274. Typically, when the transmit power amplifier 274 is switched it creates a 'pulling' effect on the transmit VCO 268 due to a change in load impedance seen by the transmit VCO 268. This pulling effect from the transmit power amplifier 274 can take a conducted or radiated path. To minimize the effects of any radiated effect, the upconversion and modulation portion 252-270 of the transmitter 150 is laid out in section 306 of the analog layer and the transmission circuit 272 of the transmitter 250 steps is laid out in section 308 of the analog layer. Accordingly, the two circuit blocks 306 and 308 will be sufficiently isolated from each other once housed, despite being forced to be in direct proximity due to the space constraints.

The receiver is separated into three components 302, 304 and 305 due the physically small solution for channel filtering. The most advanced technology on the market that meets the selectivity profile of >80 dBc at the second IF image (45 MHz−2(455 kHz)=44.09 MHz and size (5×7×1.4 mm) is a crystal (double quartz) monolithic filter 222. However, when placed down on the PCB, measurements showed that feedthrough coupling at 44.09 MHz reducing selectivity by approximately 20 dB.

In order to inhibit this problem, the input match circuit 220-222 is laid out in one section 302 of the analog layer 102. A second section 305 of the analog layer includes the first mixer 209. The receiver PLL synthesizer 212 creates a very low noise, stable oscillator signal that mixes and downconverts the incoming RF signal. The rest of the receiver is laid out in another section 304 of the analog layer 102. Accordingly, the two circuit blocks will be sufficiently isolated from each other once housed, despite being forced to be in direct proximity due to the space constraints.

In order to further limit the feed through coupling, wire-wound inductors were replaced with ceramic, multilayer inductors thereby reducing the magnitude of radiated EM field and changing its polarization. Also, a piece of EM absorber is attached to the underside of the housing so that it will be located directly above the filter to reduce the effective coupling through the housing itself.

Yet further, in order make an even more efficient use of the PCB, it is realized that more area is required for the analog components than the digital components. Further, a second order PLL system, including a PLL integrated circuit, passive loop filter and industry-standard high performance VCO, uses approximately 0.5" by 1" of PCB surface area if routed on one side of a PCB. In addition, the feedback trace from the output of the VCO to the input of PLL integrated circuit becomes a consideration for picking up coupled noise, which can modulate the carrier and appear as spurious output at the antenna.

Accordingly, a portion of each of the PLL integrated circuits was placed on the digital side of the double-sided PCB and coupled to the analog side by thru-hole vias. Such a layout is unconventional, as thru-hole vias provide a direct path for noise to leak from one side of the PCB to the other. However, the attention to layout proved to be a success, comfortably meeting spurious emissions specifications and space constraints. Further, the layout reduced the surface area coverage 0.5" by 0.5" on the analog side of the PCB. Although the overall area used is not reduced, the present layout utilizes available space on the digital side of the PCB while freeing up space on the more congested analog side of the PCB. Accordingly, although risky, this unconventional layout technique facilitates the ability to fit the radio onto a Type III PC card.

Although the embodiment described above refers specifically to a Type III PC-card, a person of ordinary skill will appreciate that the PC-card radio described herein can be adapted to conform to other standards or proprietary systems of similar or larger size. Further, although reference to specific components are disclosed herein, a person of ordinary skill in the art will appreciate that other components that provide similar functionality may also be used as desired.

Although preferred embodiments of the invention have been described herein, it will be understood by those skilled in the art that variations may be made thereto without departing from the spirit of the invention or the scope of the appended claims.

What is claimed is:

1. A network communication card for facilitating ultra high frequency (UHF) radio communication between a terminal and a base station, comprising:
   a double-sided printed circuit board (PCB);
   a digital interface for communicating between the network communication card and the terminal;
   a receiver for receiving incoming radio signals from the base station and processing the received signals for communication to the terminal via the digital interface;
   a transmitter for transmitting outgoing radio signals from the terminal via the digital interface to the base station, including:
      a digital synthesizer operating on a digital signal to be transmitted, the digital synthesizer being clocked by a first clock signal at a first rate and responsive to the digital signal to be transmitted to produce a modulated carrier signal;
      an upconversion circuit operating on the first clock signal to create a second clock signal having a second clock rate greater than the first rate;
      a transmit mixer to mix the output of the modulated carrier signal from the digital synthesizer with the second clock signal to produce an upconverted signal;
      a filter for filtering spurious content from the upconverted signal to produce a filtered upconverted signal;
      a transmit oscillator comprising:
         a phase locked loop (PLL) receiving the filtered upconverted signal as an input to generate a transmission signal and to transmit the transmission signal via an antenna;
   wherein at least a portion of each of the transmitter and the receiver are laid out on a first side of the PCB, wherein at least a portion of the digital interface is laid out on a second side of the PCB, opposite to the first side of the PCB.

2. The network communication card as defined in claim 1, is designed to conform to a small form factor.

3. The network communication card as defined in claim 2, wherein the form factor is PC-Card Type III.

4. The network communication card as defined in claim 1, wherein the receiver comprises a phase locked loop, and wherein at least a portion of the phase locked loop of the receiver is laid out on the second side of the PCB and is in communication with the first side of the PCB via an electrical connection through the PCB.

5. The network communication card as defined in claim 1, wherein at least a portion of the phase locked loop of the transmitter is laid out on the second side of the PCB and is in communication with the first side of the PCB via an electrical connection through the PCB.

6. The network communication card as defined in claim 1, wherein the first side of the PCB is divided into compartments, each compartment for including portions of the transmitter and receiver that are least likely to interfere with each other, the compartments being delineated by conducting ground traces.

7. The network communication card as defined in claim 6, wherein the conducting ground traces are arranged to correlate with shield walls in a housing such that when the network communication card is encased in the housing, the shield walls are in contact with the conducting ground traces thereby creating separately housed compartments.

8. The network communication card as defined in claim 1, wherein the upconversion circuit comprises a harmonic selection filter for selecting a harmonic of a clock signal for mixing with the output of the digital synthesizer for providing the increased frequency carrier signal.

9. The network communication card as defined in claim 1, wherein the digital synthesizer produces a carrier signal of the order of 1 MHz using the first clock signal.

10. The network communication card as defined in claim 1, wherein the rate of the second clock signal is at least three times the rate of the first clock signal.

11. The network communication card as defined in claim 1, wherein the filter is a surface acoustic wave (SAW) filter.

12. The network communication card as defined in claim 1, wherein the modulated carrier signal is 2-FSK modulated.

13. The network communication card as defined in claim 1, wherein the modulated carrier signal is 4-FSK modulated.

* * * * *